(12) United States Patent
Wen et al.

(10) Patent No.: US 12,422,452 B2
(45) Date of Patent: Sep. 23, 2025

(54) DEVICE FOR MEASURING AIR SPEED

(71) Applicant: FOXSEMICON INTEGRATED TECHNOLOGY, INC., Miao-Li Hsien (TW)

(72) Inventors: Si-Yu Wen, Miaoli Hsien (TW);
Chun-Kai Huang, Miaoli Hsien (TW);
Chun-Chung Chen, Miaoli Hsien (TW)

(73) Assignee: FOXSEMICON INTEGRATED TECHNOLOGY, INC., Miao-Li Hsien (TW)

( * ) Notice: Subject to any disclaimer, the term of this patent is extended or adjusted under 35 U.S.C. 154(b) by 301 days.

(21) Appl. No.: 18/199,855

(22) Filed: May 19, 2023

(65) Prior Publication Data

US 2023/0417791 A1     Dec. 28, 2023

(30) Foreign Application Priority Data

May 19, 2022   (CN) .......................... 202210558081.1

(51) Int. Cl.
*G01F 5/00*      (2006.01)
*G01P 5/00*      (2006.01)
*H01L 21/673*   (2006.01)

(52) U.S. Cl.
CPC .......... *G01P 5/00* (2013.01); *H01L 21/67389* (2013.01)

(58) Field of Classification Search
CPC ......... H01L 21/67389; H01L 21/67253; G01P 5/00; G01P 1/026; G01P 1/00
See application file for complete search history.

(56) References Cited

U.S. PATENT DOCUMENTS

2006/0222478 A1   10/2006   Wakabayashi

FOREIGN PATENT DOCUMENTS

| CN | 111987011 A | * | 11/2020 | ....... H01L 21/67017 |
| JP | 2009218309 A | * | 9/2009 | ........... H01L 21/677 |
| JP | 2012204645 A | * | 10/2012 | ....... H01L 21/67772 |
| KR | 20070038741 A | * | 4/2007 | ....... H01L 21/67017 |
| WO | 2005109474 A1 | | 11/2005 | |

* cited by examiner

*Primary Examiner* — Benjamin R Schmitt
(74) *Attorney, Agent, or Firm* — ScienBiziP, P.C.

(57) ABSTRACT

A device includes one or more fixing members and one or more air speed measuring members. Each fixing members is received and held in one receiving groove. Each air speed measuring member is arranged on one fixing member. Each air speed measuring member includes one or more sensors. Each sensor extends outside the wafer box and is positioned below an air curtain. Each sensor is configured to measure an air speed near the air outlet of the air curtain. A related wafer box includes the above device.

20 Claims, 6 Drawing Sheets

DEVICE FOR MEASURING AIR SPEED

FIELD

The subject matter herein generally relates to semiconductor processing technology, and particularly to a device for measuring air speed.

BACKGROUND

A Front Opening Unified Pod (hereinafter FOUP) can be commonly employed to store and transfer wafers. The FOUP needs to be sealed to protect the wafers from contaminants by preventing contaminants, such as dust, moisture, oxygen gas, and the like in the environment from entering into the FOUP, and from reacting with the wafers in the FOUP because such reactions may cause faulty circuits, such as a short circuit and an open circuit. A fabrication yield of the wafers can be further improved. In an actual manufacturing processing, the FOUP can be in an open state, which is convenient to transfer the wafers in the FOUP to a wafer processing device. An air curtain is arranged between the FOUP and the wafer processing device to inhibit air convection, therefore an influent of the external environment to the FOUP may be reduced. An air speed and a degree of uniformity of an air stream forced by the air curtain can directly influence a success rate of the wafer manufacturing. However, it is difficult to efficiently and accurately measure the air speed near the air curtain.

SUMMARY

An embodiment of the present application provides a device for measuring the air speed which is capable of measuring an air speed near an air outlet of an air curtain.

In a first aspect, an embodiment of the present application provides a device for measuring air speed. The device is configured to measure the air speed near an air outlet of an air curtain. The air curtain is mounted near an open of a wafer box to force an air stream near the open of the wafer box. A number of receiving grooves is defined in the wafer box. The receiving grooves are configured to receive a number of wafers. The device includes one or more fixing members and one or more air speed measuring members. Each fixing member is received and held in one receiving groove. Each air speed measuring member is arranged on one fixing member. Each air speed measuring member includes one or more sensors. Each sensor extends outside the wafer box and is positioned below the air curtain. Each sensor is configured to measure the air speed near the air outlet of the air curtain.

According to some embodiments of the present application, each air speed measuring member further includes a main body and one or more probing rods. Each main body is arranged on one fixing member. A first end of each probing rod is coupled to one main body, and a second end of each probing rod is coupled to one sensor.

According to some embodiments of the present application, a number of probing rods are employed to illustrate the disclosure. A first end of each probing rod is rotatably coupled to the main body, and a second end of each probing rod is coupled to a corresponding sensor. The sensors of each air speed measuring member are arranged at a preset interval and on a horizontal plane, the horizontal plane is below an entirety of the air curtain.

According to some embodiments of the present application, the device further includes one or more sliding members. Each sliding member is arranged on one fixing member, and each sliding member is coupled to one air speed measuring member. Each sliding member is configured to drive the one or more sensors of a corresponding air speed measuring member to move away from or move toward the wafer box.

According to some embodiments of the present application, the receiving grooves defined in the wafer box are spaced apart from each other along a vertical direction of the wafer box, and are arranged at different heights in the wafer box. A number of fixing members are employed to illustrate the disclosure, each fixing member is received in one receiving groove, and a number of the fixing members are less than a number of the receiving grooves.

According to some embodiments of the present application, a shape and a size of each fixing member match with a shape and a size of the wafer.

According to some embodiments of the present application, the device further includes one or more control units. Each control unit is configured to transmit a control signal to a corresponding one or more sensors. The corresponding one or more sensors are configured to detect the air speeds after receiving the control signal.

According to some embodiments of the present application, the device further includes one or more switching units. Each switching unit is electrically coupled to a corresponding control unit. Each control unit is configured to control the corresponding one or more sensors to detect the air speeds when a corresponding switching unit is turned on.

According to some embodiments of the present application, the device further includes one or more storage units and one or more wireless transmission units. Each storage unit and a corresponding wireless transmission unit are electrically coupled to a corresponding control unit. Each storage unit is configured to store data detected by the corresponding one or more sensors. Each wireless transmission unit is configured to transmit the stored data to an electronic device external to the device.

According to some embodiments of the present application, each control unit, a corresponding storage unit, and the corresponding wireless transmission unit are all accommodated in one air speed measuring member.

Comparing to a nowadays technology, the disclosure has the following beneficial effects:

In the disclosure, the one or more fixing members and the one or more air speed measuring members are arranged together to form the device, the device is attached into the wafer box, and the one or more sensors extends outside the wafer box to be positioned below the air curtain, thus the air speed near the air curtain can be measured.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Implementations of the disclosure will now be described, by way of embodiments only, with reference to the drawings. The disclosure is illustrative only, and changes may be made in the detail within the principles of the present disclosure. It will therefore be appreciated that the embodiments may be modified within the scope of the claims.

In addition, it should be understood that in the description of this application, terms such as "first" and "second" are used only for distinguishing in the description, but are not intended to indicate or imply relative importance or an order. The terms "exemplary" and/or "example" are used herein to mean "serving as an example, instance, or illustration." Any embodiment described herein as "exemplary" and/or "example" is not necessarily to be construed as preferred or advantageous over other embodiments. A feature limited by "first", "second" may expressly or implicitly include one or more of the features. Use of the word "exemplary" is intended to present concepts and techniques in a concrete fashion. As used herein, the term "and/or," includes any and all combinations of one or more of the associated listed items.

It should be noted that the steps shown in the flowcharts can be performed by computer executable instructions in a computer system. In addition, although a logical sequence is shown in the flowcharts, in some circumstance, the shown or described steps may be performed in a sequence which is different from the sequence described herein.

Now, a Front Opening Unified Pod (hereinafter FOUP) can be commonly employed to store and transfer wafers. The FOUP needs to be sealed to protect the wafers from contaminants, for example, prevent the contaminants, such as dust, moisture, oxygen gas, and the like in the environment from entering into the FOUP, and from reacting with the wafers in the FOUP because such reactions may causes faulty circuits, such as a short circuit and an open circuit. Thus, a fabrication yield of the wafers can be further improved. In an actual manufacturing processing, the FOUP can be in an open state, which is convenient to transfer the wafers in the FOUP to a wafer processing device. Thus, an air curtain is arranged between the FOUP and the wafer processing device to inhibit air convection, therefore an influent of the external environment to the FOUP may be reduced. An air speed and a degree of uniformity of an air stream forced by the air curtain can directly influence a success rate of the wafer manufacturing. However, it is difficult to efficiently and accurately measure the air speed near the air curtain.

Thus, the disclosure provides a device for measuring air speed which is capable of efficiently measuring the air speed near an air outlet of the air curtain, where the air curtain is arranged between the wafer box and the wafer processing device.

Embodiment 1

Figure 1:
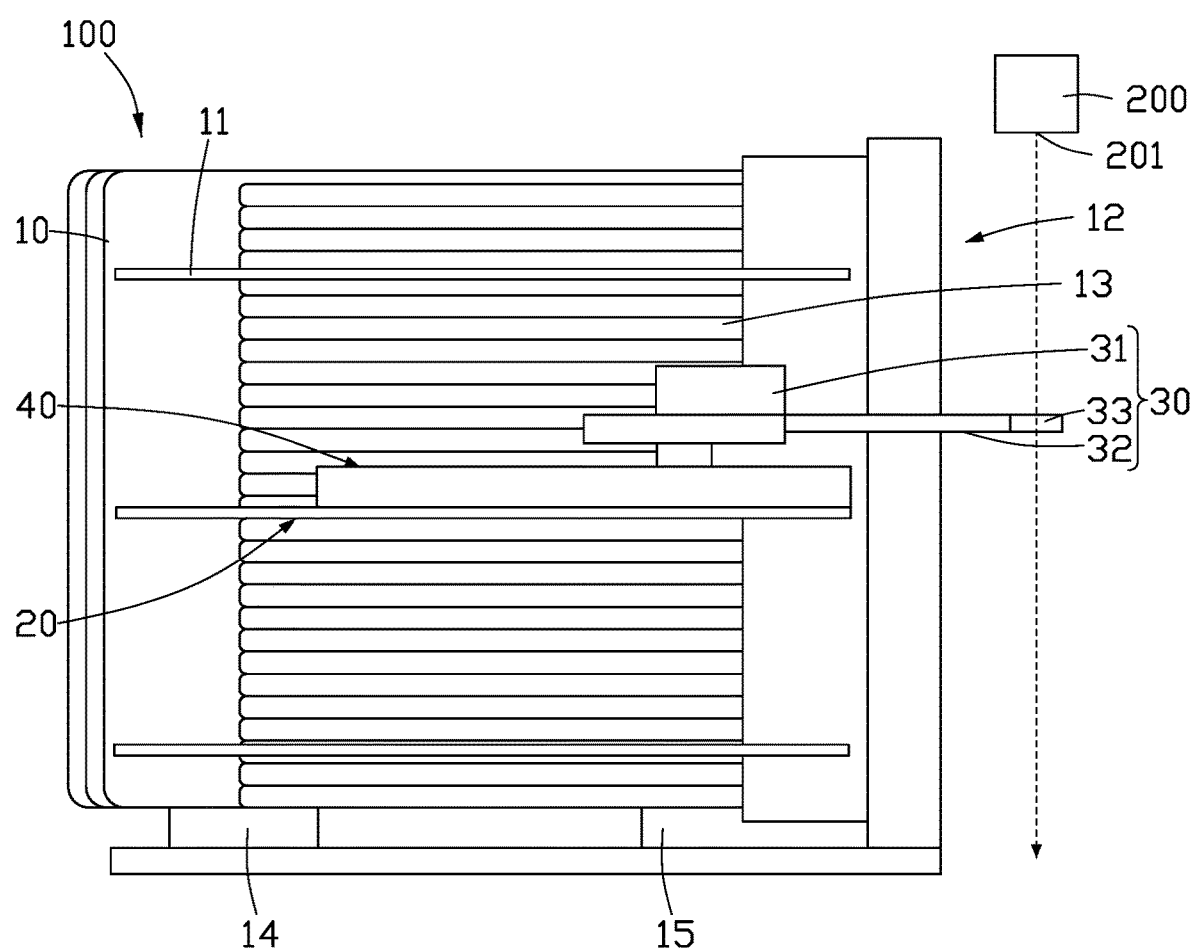
FIG. 1 is a side view of an embodiment of a device for measuring air speed, an air curtain, and other components.

FIG. 1 is a side view of an embodiment of a device for measuring air speed, an air curtain, and other components.

In the FIG. 1, the device for measuring air speed 100 includes a fixing member 20 and an air speed measuring member 30.

The fixing member 20 is arranged in the wafer box 10. The wafer box 10 is configured to transfer the wafers 11 or receive the fixing member 20. The wafer box 10 defines an open 12 at a side of the wafer box 10. A movable door is arranged in the open 12. The movable door can be open by some devices or an operator. Thus, the wafer 11 (or the fixing member 20) held in the wafer box 10 can be taken out via the open 12, or the wafer 11 (or the fixing member 20) can be held in the wafer box 10 via the open 12.

A number of receiving grooves 13 are defined in the wafer box 10. Each receiving groove 13 is configured to receive and hold one wafer 11 or one fixing member 20. In one embodiment, the receiving grooves 13 are stacked arranged in the wafer box 10. For example, the wafer box 10 of the embodiment defines a number of receiving grooves 13, for example twenty-five receiving grooves. The receiving grooves 13 defined in the wafer box 10 are spaced apart from each other along a vertical direction of the wafer box 10, and are arranged at different heights in the wafer box 10.

A bottom of the wafer box 10 further defines an inlet opening 14 and an outlet opening 15. The inlet opening 14 and the outlet opening 15 are respectively configured to cooperate with an air charging device and an air extracting device to exchange the air in the wafer box 10. For example, the air charging device can introduce the air into the wafer box 10 via the inlet opening 14, and the air extracting device can exhaust the air from the wafer box 10 via the outlet opening 15. Thus, the air charging device and the air extracting device can exchange the air in the wafer box 10, therefore the moisture and the oxygen in the wafer box 10 can be cleared up, and the wafers 11 in the wafer box 10 can be stored for longer time.

In the embodiment, the fixing member 20 is held in the receiving groove 13 and is arranged inside the wafer box 10. It can be understood that, a shape and/or a size of the fixing member 20 match with a shape and/or a size of the wafer 11. In some embodiments, the shape and the size of the fixing member 20 are the same or similar to the shape and the size of the wafer 11. Thus, the fixing member 20 can be securely held in the receiving groove 13 which is originally used to hold the wafer 11.

The air speed measuring member 30 is arranged on the fixing member 20 and is adjacent to the open 12. The air speed measuring member 30 includes a main body 31, a probing rod 32, and a sensor 33. The main body 31 is arranged on the fixing member 20. A first end of the probing rod 32 is coupled to the main body 31. A second end of the probing rod 32, namely an end of the probing rod 32 away from the main body 31, extends away from the main body 31 and is outside the open 12. The sensor 33 is arranged on the second end of the probing rod 32 and corresponds to the air curtain 200. For example, the sensor 33 is arranged below the air curtain 200. The sensor 33 is configured to measure the air speed near the open 12.

It can be understood that, a number of air speed measuring members 30 can be employed to illustrate the disclosure and are arranged in one wafer box 10. For example, the air speed measuring members 30 are attached to the fixing members 20 which are received in the receiving grooves 13 at different heights, to measure the air speeds below the air curtain 200 at different heights.

In some embodiments, each main body 31 can provide for coupling one probing rod 32, and also can be hollow to receive the other components.

It can be understood, the one or more fixing members 20 and the one or more air speed measuring members 30 are arranged together to form the device for measuring air speed 100, the device for measuring air speed 100 is attached into the wafer box 10, and the one or more sensors 33 extend outside the wafer box 10 to be arranged below the air curtain 200, thus the air speeds near the air curtain 200 can be measured.

Figure 2:
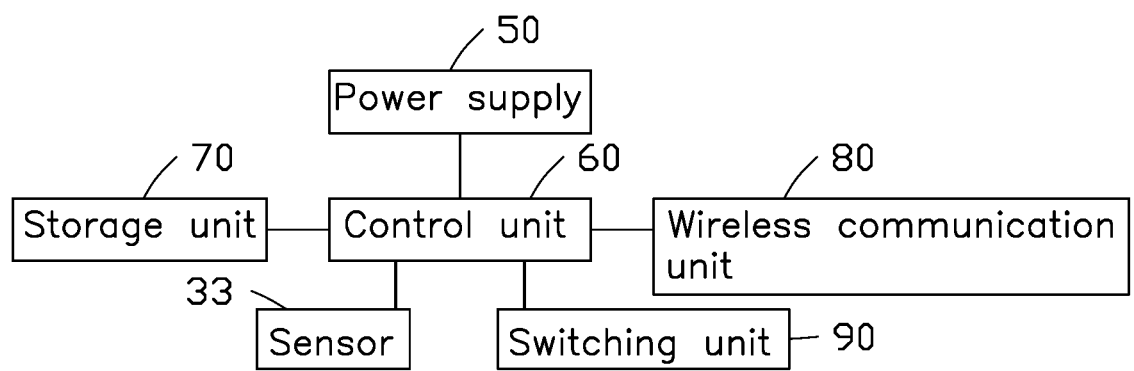
FIG. 2 is a block diagram of an embodiment of the device for measuring air speed of the FIG. 1.

Referring also to FIG. 2, in the embodiment, the device for measuring air speed 100 further includes one or more power supplies 50, one or more control units 60, one or more storage units 70, one or more wireless communication units 80, and one or more switching units 90. Each power supply 50, a corresponding control unit 60, a corresponding storage unit 70, a corresponding wireless communication unit 80, and a corresponding switching unit 90 can be integrated to one air speed measuring member 30, for example be in one air speed measuring member 30 or on one or more surfaces of one air speed measuring member 30.

Each power supply 50 is configured to provide power for a corresponding one or more sensors 33, the corresponding control unit 60, the corresponding storage unit 70, the corresponding wireless communication unit 80, the corresponding switching unit 90, and the like. Each power supply 50 can include a battery and a power supply control board. The power supply control board is configured to control a charge of a corresponding battery, a discharge of the corresponding battery, a power consumption management, and the like.

Each storage unit 70 may be configured to store computer program instruction and various data, for example be configured to store signal measured by the corresponding one or more sensors 33. Each storage unit 70 mainly includes a program storage area and a data storage area. The program storage area may store an operating system, control program, and computer program instruction, such as a text editor. The data storage area may store data created according to use of the device for measuring air speed 100, and the like. Each storage unit 70 can include high-speed random access memory and non-transitory storage medium, such as a disk storage device, a flash memory, or other transitory storage medium.

The control units 60 is a control center of the device for measuring air speed 100. Various parts of an entire device for measuring air speed 100 are electrically connected to the control units 60. Each control unit 60 is configured to transmit a first control signal to the corresponding one or more sensors 33, for example a triggering signal to the corresponding one or more sensors 33. The one or more sensors 33 can start to detect the air speeds when the first control signal is received, and store the detected data to the corresponding storage unit 70.

Each wireless communication unit 80 is configured to transmit the data stored in the corresponding storage unit 70 to an electronic device external to the device for measuring air speed 100. The electronic device can be a personal computer, a tablet computer, a mobile phone, a PDA, or the like, and is not limited herein.

Each switching unit 90 is configured to control an on or an off of the corresponding one or more sensors 33. In detail, when each switching unit 90 is triggered (turned on), the corresponding control unit 60 can control the corresponding one or more sensors 33 to measure the one or more air speeds. When each switching unit 90 is no triggered (turned off), the corresponding control unit 60 can control the one or more sensors 33 to stop measuring the one or more air speeds. Therefore, the one or more sensors 33 can be turned on in advance via the switching unit 90 when a physical property measurement is needed, and the one or more sensors 33 can be turned off via the switching unit 90 after measuring.

It can be understood that, in some embodiments, each power supply 50, the corresponding control unit 60, the corresponding storage unit 70, the corresponding wireless communication unit 80 are all arranged in the hollow of the main body 31 of one air speed measuring member 30.

It can be understood that, the wafer box 10 can include the device for measuring air speed 100, the disclosure is not limited herein.

Embodiment 2

Figure 3:
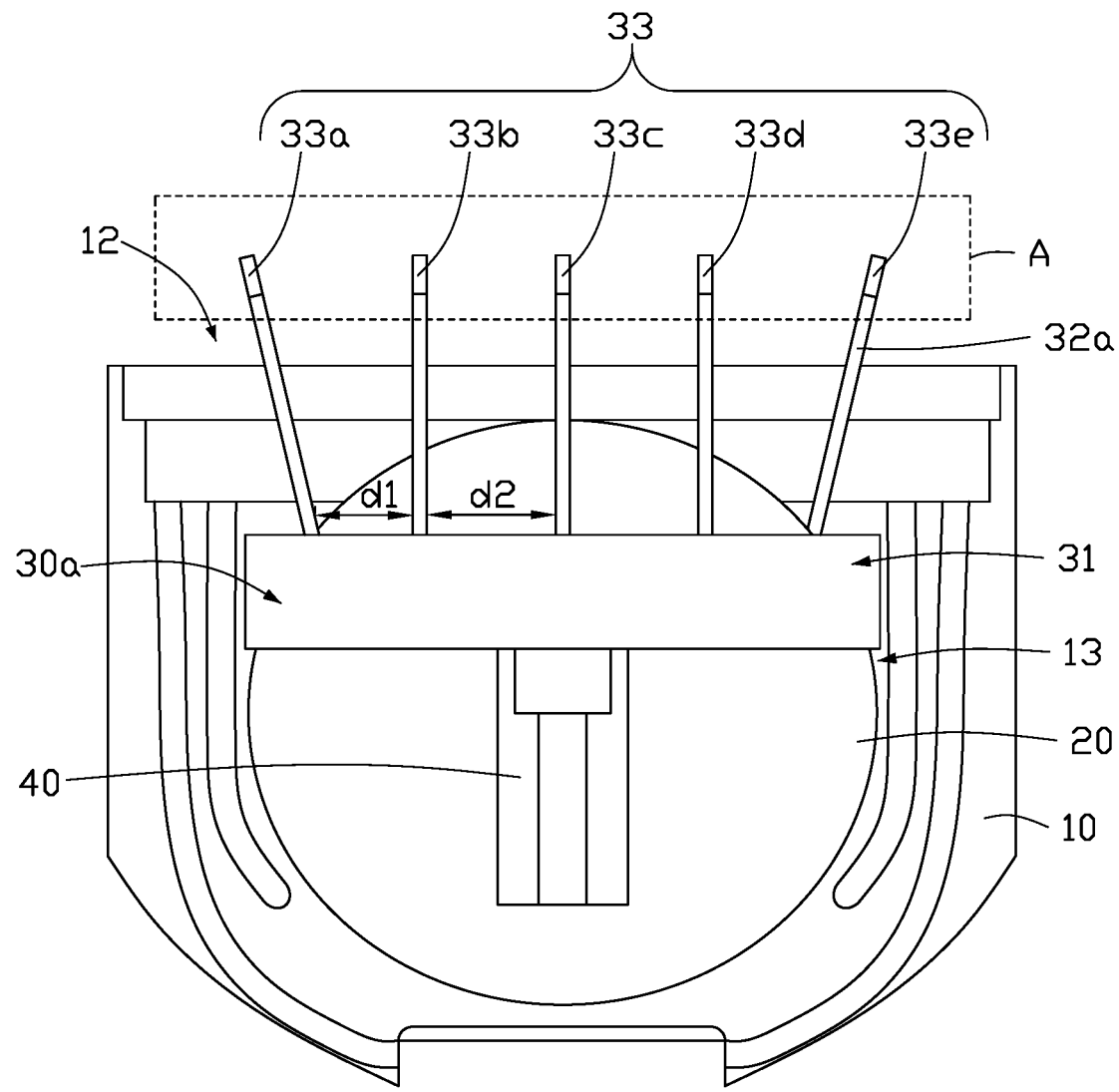
FIG. 3 is a top view of an embodiment of the device for measuring air speed of the FIG. 1.

Referring to FIG. 3, a structure of the device for measuring air speed 100a is similar to a structure of the device for measuring air speed 100 in the FIG. 1, except that: each air speed measuring member 30a in the device for measuring air speed 100a includes a number of probing rods 32a. Each sensor 33 is arranged on the second end of one probing rod 32a which is away from the main body 31. The sensors 33 are arranged at interval under the entirety of the air curtain 200, where the area under the entirety of the air curtain 200 is the area A shown in the FIG. 3.

Obviously, in the embodiment 2, the device for measuring air speed 100a includes the one or more air speed measuring members 30a. Each air speed measuring member 30a includes a number of probing rods 32a and a number of sensors 33. Each sensor 33 is arranged on one probing rod 32a. Thus, the air speeds at different points of the area A can be measured via the sensors 33 at the corresponding probing rod 32a, therefore, whether the air stream near the open 12 forced by the air curtain 200 is uniform is determined.

It can be understood that, as shown in the FIG. 3, when a number of probing rods 32a in the air speed measuring member 30a are employed, first ends of a part of probing rods 32a each being adjacent to the end of the main body 31 are rotatably coupled to the main body 31. For example, two probing rods 32a at two sides of the main body 31 are rotatably coupled to the main body 31, and a distance between each of the two probing rods 32a and a corresponding adjacent inside probing rod 32a is a first interval d1 as shown in the FIG. 3. The other probing rods 32a between the two probing rods 32a each is fixed to the main body 31 and are arranged at a second interval d2. The first interval d1 is less than the second interval d2.

In some embodiments, a length of the main body 31 in the wafer box 10 is less than a length of an air outlet region of the air curtain 200, namely is less than a length of the region A. If all probing rods 32a are arranged to be perpendicular to the main body 31, the air speed at an outermost areas of the region A cannot be measured. It can be understood that, for each air speed measuring member 30a, the outermost two probing rods 32a are rotatably coupled to the main body 31, thus each of a part of probing rods 32a which extends outside the open 12 can open at a certain angle at a horizontal plane, for example at a plane where the fixing member 20 is located or a plane below an entirety of the air curtain, thus the sensors 33 can be arranged at a fixed interval, for example be arranged at a second interval d2. Thus, the air speed measuring member 30a can measure the air speed at the outermost area under the air curtain 200, and due to being arranged at the fixed interval, the measured data by the air speed measuring member 30a can reflect a uniformity of the air speeds at a number of points at a same horizontal plane better.

It can be understood that, in other embodiments, the air speed measuring member includes a number of probing members 32a, and the first end of each probing rod 32a which is adjacent to the main body 31 is rotatably coupled to the main body 31.

Embodiment 3

Figure 4:
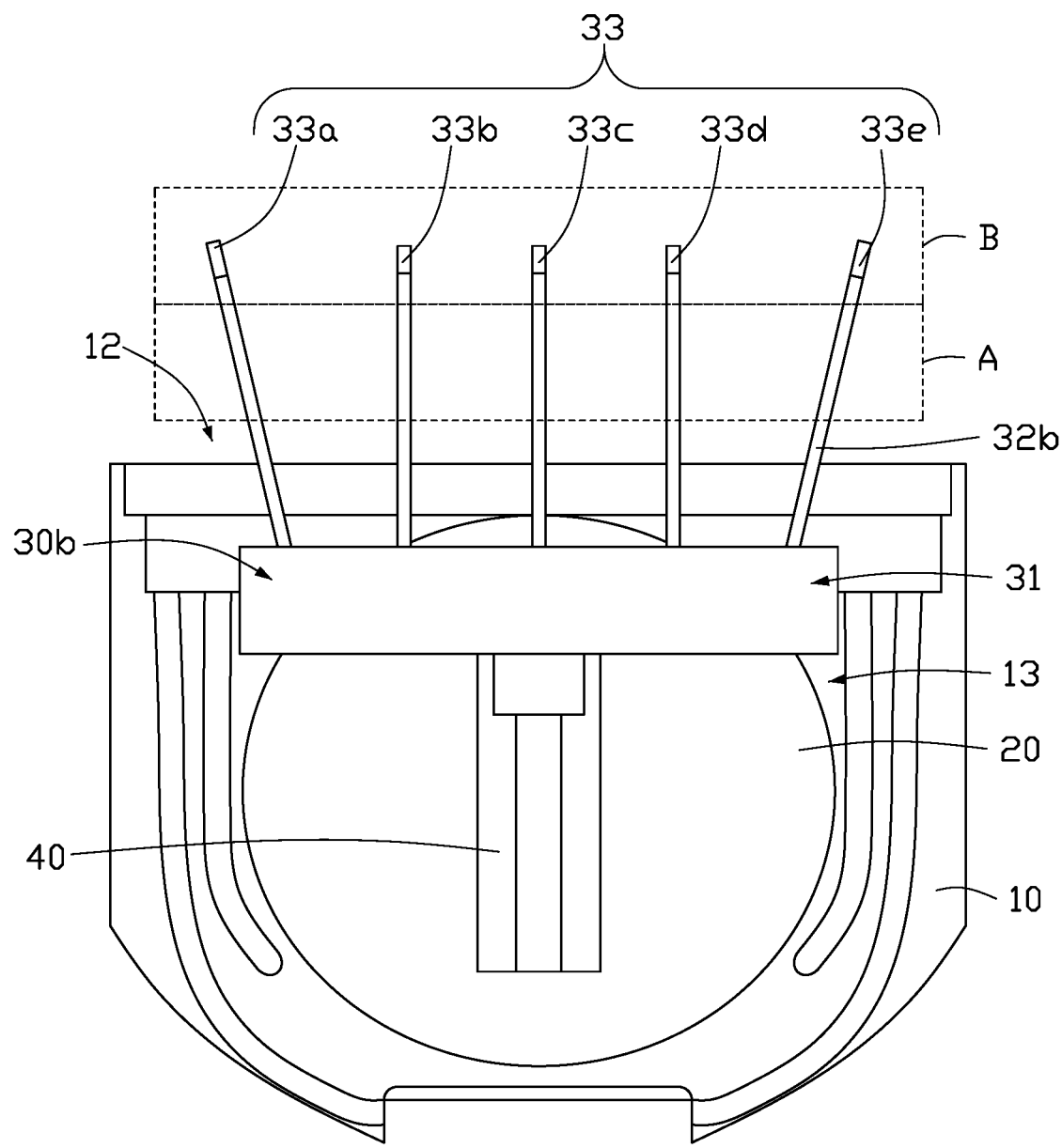
FIG. 4 is a top view of another embodiment of the device for measuring air speed of the FIG. 1.

Referring to FIG. 4, a structure of the device for measuring air speed 100b is similar to a structure of the device for measuring air speed 100a in the FIG. 3, except that: the one or more air speed measuring members 30b in the device for measuring air speed 100b can measure the air speeds under the air curtain 200, and measure the air speeds below a side of (obliquely below) the air curtain 200, for example, the region B as shown in the FIG. 4, namely the one or more air speed measuring members 30b in the device for measuring air speed 100b can measure the air speeds below the side of (obliquely below) an entirety of the air curtain 200 where is away from the air curtain 200.

In the FIG. 4, the device for measuring air speed 100b further includes one or more sliding members 40. Each air speed measuring member 30b can be arranged on one sliding member 40, and can move at a driving of the sliding member 40, thus the probing rods 32b and the sensors 33 of the air speed measuring member 30b can move away from or move toward the wafer box 10. It can be understood that, due to an arrangement of the one or more sliding members 40, the one or more air speed measuring members 30b can measure the air speeds under the entirety of the air curtain 200, and can be driven to measure the air speeds below the side of the entirety of the air curtain 200 where is away from the wafer box 10.

In some embodiments, some air speed measuring members 30b can measure the air speeds under the air curtain 200, and some air speed measuring members 30b can measure the air speeds below the side of the air curtain 200, thus the air speed measuring members 30b can measure the air speeds under the air curtain 200, and simultaneously measure the air speeds below the side of the air curtain 200 where is away from the wafer box 10.

It can be understood that, the device for measuring air speed 100 in the FIG. 1 and the device for measuring air speed 100a in the FIG. 3 can also include the one or more sliding members 40, the disclosure is not limited herein.

Figure 5:
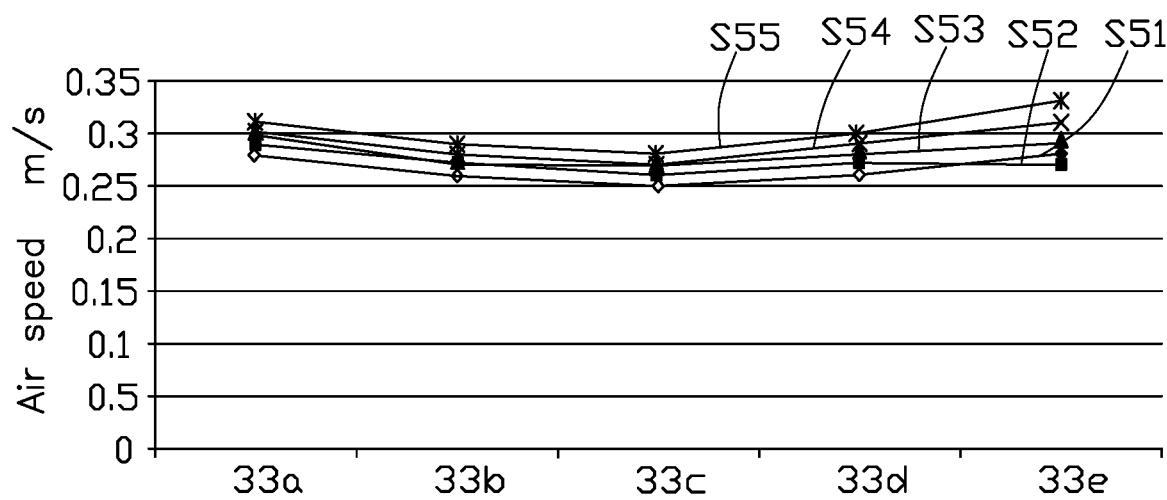
FIG. 5 is a view of an embodiment showing air speeds under the air curtain measured by an air speed measuring member.

Referring to FIGS. 3-5, where FIG. 5 is a curve diagram showing the air speeds under the air curtain 200 measured by a number of devices for measuring air speed 100a. The devices for measuring air speed 100a are arranged in one wafer box 10. The disclosure takes as an example that the devices for measuring air speed are the devices for measuring air speed 100a as shown in the FIG. 3 and each device for measuring air speed 100a includes one fixing member 20. It can be understood that, the device for measuring air speed can be the device for measuring air speed 100b and each device for measuring air speed can include a number of fixing members 20, the disclosure is not limited herein. A curve diagram S51, a curve diagram S52, a curve diagram S53, a curve diagram S54, and a curve diagram S55 show the air speeds measured by the devices for measuring air speed 100a partly arranged in the receiving grooves 13 respectively at a first layer, a fifth layer, a tenth layer, a fifteen layer, and a twentieth layer. Each device for measuring air speed 100a includes the sensor 33a, the sensor 33b, the sensor 33c, the sensor 33d, and the sensor 33e as shown in the FIG. 3.

Obviously, according to the FIG. 5, the more adjacent the devices for measuring air speed 100a which are partly received in the receiving grooves 13 to the air curtain 200, the higher the air speeds are measured by the devices for measuring air speed 100a. For example, the air speeds measured by the device for measuring air speed 100a arranged in the twentieth layer is highest in the air speeds measured by the sensors 33.

Figure 6:
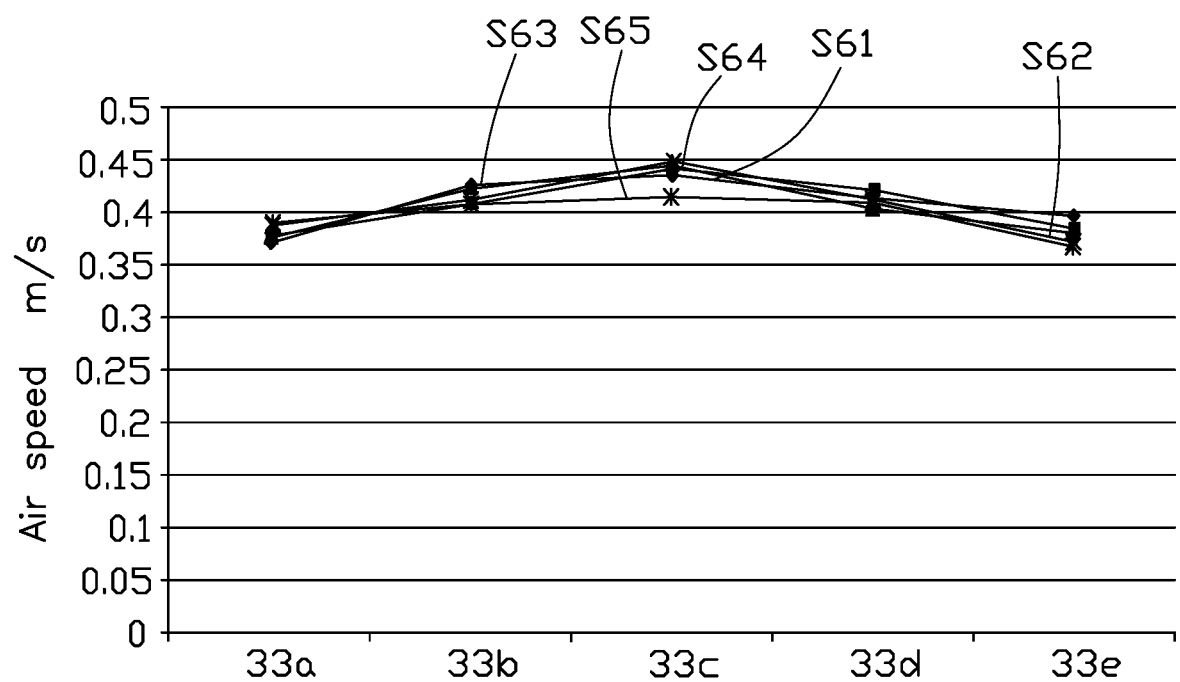
FIG. 6 is a view of an embodiment showing air speeds below a side of (obliquely below) the air curtain measured by the air speed measuring member.

Referring to FIG. 4 and FIG. 6, where FIG. 6 is a curve diagram showing the air speeds below the side of (obliquely below) the entirety of the air curtain 200 measured by a number of device for measuring air speeds 100b respectively partly arranged in different receiving grooves 13, for example a curve diagram showing the air speeds below the side of (obliquely below) the air curtain 200 where distances 50 mm away from the wafer box 10. The devices for measuring air speeds 100b are simultaneously arranged in one wafer box 10. The disclosure takes as an example that each device for measuring air speed 100b includes one fixing member 20. It can be understood that, each device for measuring air speed 100b can include a number of fixing members 20, the disclosure is not limited herein. A curve diagram S61, a curve diagram S62, a curve diagram S63, a curve diagram S64, and a curve diagram S65 show the air speeds measured by the devices for measuring air speed 100b which are partly arranged in the receiving grooves 13 respectively at a first layer, a fifth layer, a tenth layer, a fifteen layer, and a twentieth layer. Each device for measuring air speed 100b includes the sensor 33a, the sensor 33b, the sensor 33c, the sensor 33d, and the sensor 33e as shown in the FIG. 4.

Obviously, according to the FIG. 6, the more adjacent each sensor 33 of each device for measuring air speed 100b to a middle position, the higher the air speed is measured by the sensor 33. Namely, below the side of the air curtain 200 away from the wafer box 10, at a same height, that is, having a same distance from the air curtain 200, the more adjacent the sensors 33 to the middle of the air curtain 200, the higher the air speeds are measured by the sensors 33. For example, the air speed measured by the sensor 33C in the sensors 33 of each device for measuring air speed 100b is highest.

In the disclosure, the one or more fixing members 20 and the one or more air speed measuring members 30/30a/30b are arranged together to form the device for measuring air speed 100/100a/100b, the device for measuring air speed 100/100a/100b is attached into the wafer box 10, and the one or more sensors 33 extend outside the wafer box 10 to be below the air curtain 200, thus the air speed of an air stream near the open 12 forced by the air curtain 200 can be available, accurately, portably, and efficiently measured.

It should be emphasized that the above-described embodiments of the present disclosure, including any particular embodiments, are merely possible examples of implementations, set forth for a clear understanding of the principles of the disclosure. Many variations and modifications can be made to the above-described embodiment(s) of the disclosure without departing substantially from the spirit and principles of the disclosure. All such modifications and variations are intended to be included herein within the scope of this disclosure and protected by the following claims.

What is claimed is:

1. A device configured to measure an air speed near an air outlet of an air curtain, the air curtain being mounted near an opening of a wafer box, a plurality of receiving grooves being defined in the wafer box, each of the plurality of receiving grooves being configured to receive a wafer, the device comprising:

one or more fixing members and one or more air speed measuring members, wherein each of the one or more fixing members is configured to be received and held in one of the plurality of receiving grooves, each of the one or more air speed measuring members is arranged on one of the one or more fixing members, each of the one or more air speed measuring members comprises one or more sensors, each of the one or more sensors extends outside the wafer box and is configured to be positioned below the air curtain, each of the one or more sensors is configured to measure the air speed near the air outlet of the air curtain.

2. The device according to claim 1, wherein each of the one or more air speed measuring members further comprises a main body and one or more probing rods, the main body is arranged on a corresponding one of the one or more fixing members, a first end of each of the one or more probing rods is coupled to the main body, and a second end of each of the one or more probing rods is coupled to a corresponding one of the one or more sensors.

3. The device according to claim 2, wherein the one or more probing rods are a plurality of probing rods, a first end of each of the plurality of probing rods is rotatably coupled to the main body, and a second end of each of the plurality of probing rods is coupled to the corresponding one of the one or more sensors, the one or more sensors of each of the one or more air speed measuring members are arranged at a preset interval and on a horizontal plane, the horizontal plane is below an entirety of the air curtain.

4. The device according to claim 1, wherein the device further comprises one or more sliding members, each of the one or more sliding members is arranged on one of the one or more fixing members, and each of the one or more sliding members is coupled to one of the one or more air speed measuring members, each of the one or more sliding members is configured to drive the one or more sensors of a corresponding one of the one or more air speed measuring members to move away from or move toward the wafer box.

5. The device according to claim 1, wherein the receiving grooves defined in the wafer box are spaced apart from each other along a vertical direction of the wafer box, and are arranged at different heights in the wafer box, the one or more fixing members are a plurality of fixing members, each of the plurality of fixing members is received in one of the plurality of receiving grooves, and a number of the plurality of fixing members is less than a number of the plurality of receiving grooves.

6. The device according to claim 1, wherein a shape and a size of each of the one or more fixing members match with a shape and a size of the wafer.

7. The device according to claim 1, wherein the device further comprises one or more control units, each of the one or more control units is configured to transmit a control signal to a corresponding one or more sensors, the corresponding one or more sensors are configured to detect the air speeds after receiving the control signal.

8. The device according to claim 7, wherein the device further comprises one or more switching units, each of the one or more switching units is electrically coupled to a corresponding one of the one or more control units, each of the one or more control units is configured to control the corresponding one or more sensors to detect the air speeds when a corresponding one of the one or more switching units is turned on.

9. The device according to claim 7, wherein the device further comprises one or more storage units and one or more wireless transmission units, each of the one or more storage units and a corresponding one of the one or more wireless transmission units are electrically coupled to a corresponding one of the one or more control units, each of the one or more storage units is configured to store data detected by the corresponding one or more sensors, each of the one or more wireless transmission units is configured to transmit the stored data to an electronic device external to the device.

10. The device according to claim 9, wherein each of the one or more control units, a corresponding one of the one or more storage units, and the corresponding one of the one or more wireless transmission units are all accommodated in one of the one or more air speed measuring members.

11. A wafer box comprising a device, the device being configured to measure an air speed near an air outlet of an air curtain, an opening of the wafer box being configured to be arranged near the air curtain, a plurality of receiving grooves being defined in the wafer box, each of the plurality of receiving grooves being configured to receive a wafer, the device comprising:

one or more fixing members and one or more air speed measuring members, wherein each of the one or more fixing members is configured to be received and held in one of the plurality of receiving grooves, each of the one or more air speed measuring members is arranged on one of the one or more fixing members, each of the one or more air speed measuring members comprises one or more sensors, each of the one or more sensors extends outside the wafer box and is configured to be positioned below the air curtain, each of the one or more sensors is configured to measure the air speed near the air outlet of the air curtain.

12. The wafer box according to claim 11, wherein each of the one or more air speed measuring members further comprises a main body and one or more probing rods, the main body is arranged on a corresponding one of the one or more fixing members, a first end of each of the one or more probing rods is coupled to the main body, and a second end of each of the one or more probing rods is coupled to a corresponding one of the one or more sensors.

13. The wafer box according to claim 12, wherein the one or more probing rods are a plurality of probing rods, a first end of each of the plurality of probing rods is rotatably coupled to the main body, and a second end of each of the plurality of probing rods is coupled to the corresponding one of the one or more sensors, the one or more sensors of each of the one or more air speed measuring members are arranged at a preset interval and on a horizontal plane, the horizontal plane is below an entirety of the air curtain.

14. The wafer box according to claim 11, wherein the device further comprises one or more sliding members, each of the one or more sliding members is arranged on one of the one or more fixing members, and each of the one or more sliding members is coupled to one of the one or more air speed measuring members, each of the one or more sliding members is configured to drive the one or more sensors of a corresponding one of the one or more air speed measuring members to move away from or move toward the wafer box.

15. The wafer box according to claim 11, wherein the receiving grooves defined in the wafer box are spaced apart from each other along a vertical direction of the wafer box, and are arranged at different heights in the wafer box, the one or more fixing members are a plurality of fixing members, each of the plurality of fixing members is received in one of the plurality of receiving grooves, and a number of the plurality of fixing members is less than a number of the plurality of receiving grooves.

16. The wafer box according to claim 11, wherein a shape and a size of each of the one or more fixing members match with a shape and a size of the wafer.

17. The wafer box according to claim 11, wherein the device further comprises one or more control units, each of the one or more control units is configured to transmit a control signal to a corresponding one or more sensors, the corresponding one or more sensors are configured to detect the air speeds after receiving the control signal.

18. The wafer box according to claim 17, wherein the device further comprises one or more switching units, each of the one or more switching units is electrically coupled to a corresponding one of the one or more control units, each of the one or more control units is configured to control the corresponding one or more sensors to detect the air speeds when a corresponding one of the one or more switching units is turned on.

19. The wafer box according to claim 17, wherein the device further comprises one or more storage units and one or more wireless transmission units, each of the one or more storage units and a corresponding one of the one or more wireless transmission units are electrically coupled to a corresponding one of the one or more control units, each of the one or more storage units is configured to store data detected by the corresponding one or more sensors, each of the one or more wireless transmission units is configured to transmit the stored data to an electronic device external to the device.

20. The wafer box according to claim 19, wherein each of the one or more control units, a corresponding one of the one or more storage units, and the corresponding one of the one or more wireless transmission units are all accommodated in one of the one or more air speed measuring members.

* * * * *